US009116533B2

(12) United States Patent
Buthker et al.

(10) Patent No.: US 9,116,533 B2
(45) Date of Patent: Aug. 25, 2015

(54) CASCODED SEMICONDUCTOR DEVICES WITH GATE BIAS CIRCUIT

(71) Applicant: NXP B.V., Eindhoven (NL)

(72) Inventors: Henricus Cornelis Johannes Buthker, Mierlo (NL); Matthias Rose, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/215,243

(22) Filed: Mar. 17, 2014

(65) Prior Publication Data

US 2014/0300410 A1   Oct. 9, 2014

(30) Foreign Application Priority Data

Apr. 5, 2013   (EP) .................................... 13162597

(51) Int. Cl.
| H03K 17/687 | (2006.01) |
| G05F 3/24 | (2006.01) |
| H03K 17/0812 | (2006.01) |
| H03K 17/567 | (2006.01) |
| H01L 23/50 | (2006.01) |
| H03K 17/30 | (2006.01) |

(52) U.S. Cl.
CPC ............... G05F 3/247 (2013.01); H01L 23/50 (2013.01); H03K 17/08128 (2013.01); H03K 17/567 (2013.01); H01L 2924/0002 (2013.01); H03K 2017/307 (2013.01); H03K 2017/6875 (2013.01)

(58) Field of Classification Search
CPC ...... G05F 3/247; H01L 23/50; H03K 17/567; H03K 17/08128; H03K 2017/6875; H03K 2017/307
USPC ................... 327/427, 430, 436, 437
See application file for complete search history.

(56) References Cited

U.S. PATENT DOCUMENTS

| 5,396,085 | A | * | 3/1995 | Baliga ............................. 257/77 |
| 6,157,049 | A | * | 12/2000 | Mitlehner et al. ............... 257/77 |
| 6,434,019 | B2 | * | 8/2002 | Baudelot et al. ................ 363/16 |
| 7,768,758 | B2 | * | 8/2010 | Maier et al. ................... 361/93.1 |
| 7,825,435 | B2 | * | 11/2010 | Machida et al. .............. 257/195 |
| 7,852,137 | B2 | * | 12/2010 | Machida et al. .............. 327/427 |
| 8,084,783 | B2 | * | 12/2011 | Zhang ........................... 257/133 |
| 8,790,965 | B2 | * | 7/2014 | Cheah et al. .................. 438/123 |
| 2002/0153938 | A1 | | 10/2002 | Baudelot et al. |
| 2011/0019450 | A1 | | 1/2011 | Callanan et al. |
| 2012/0262220 | A1 | | 10/2012 | Springett |

FOREIGN PATENT DOCUMENTS

EP   2 521 171 A1   11/2012

OTHER PUBLICATIONS

Extended European Search Report for EP Patent Appln. No. 13162597.2 (Sep. 19, 2013).

* cited by examiner

*Primary Examiner* — Kenneth B Wells

(57) ABSTRACT

The invention provides a cascode transistor circuit with a depletion mode transistor and a switching device. A gate bias circuit is connected between the gate of the depletion mode transistor and the low power line. The gate bias circuit is adapted to compensate the forward voltage of a diode function of the switching device. The depletion mode transistor and the gate bias circuit are formed as part of an integrated circuit.

12 Claims, 8 Drawing Sheets

Gate Finger:
TH=360nm, W$_{GF}$=1.6μm

CASCODED SEMICONDUCTOR DEVICES WITH GATE BIAS CIRCUIT

CROSS-REFERENCE TO RELATED APPLICATIONS

This application claims the priority under 35 U.S.C. §119 of European patent application no. 13162597.2, filed on Apr. 5, 2013, the contents of which are incorporated by reference herein.

This invention relates to cascoded semiconductor devices. It relates in particular to a depletion mode transistor in a cascode circuit with a switching device.

The invention is of particular interest for depletion mode transistors, such as gallium nitride (GaN) transistors (e.g. GaN high electron mobility transistors (HEMTs)), or silicon carbide (SiC) field effect transistors. Basic GaN power semiconductors are depletion mode (normally-on) devices. This however has the drawback that they have to be turned off actively before the power supply is applied, otherwise the device will short-circuit the power supply. Also, depending on circumstances, a large current can flow into the gate when the device is used switching inductive loads, e.g. in the case that large negative currents (i.e. a current from source to drain instead of drain to source) can occur in the application. As this can easily destroy the gate structure, this has to be prevented.

It is possible to do this in the application circuitry, for example by adding an antiparallel diode, but this is disadvantageous, as regular silicon MOSFETs do not need such additional circuitry. Thus, this makes it unattractive to interchange an existing MOSFET for a GaN power transistor.

Attempts to introduce additional layers in the layer stack of the power semiconductor to make the device normally-off (and thereby interchangeable with MOSFETs) come together with device performance penalties. Therefore, cascoding high-voltage GaN switches with conventional low-voltage silicon MOSFETs is a viable option to combine the advantages of silicon and GaN power devices.

It is known to provide a GaN power transistor in a cascode circuit with a silicon MOSFET switch. An advantage of a cascoded switch is that existing standard gate drivers can then be used, as the device drive characteristics are mainly defined by the silicon MOSFET. Therefore the device can be used as a direct replacement for silicon MOSFETs or IGBTs.

FIG. 1 shows a well-known approach of a series connection of a normally-on gallium nitride transistor ($M_{GaN}$) and a normally-off silicon MOSFET transistor ($M_{Si}$) power switch in a cascode configuration. This approach is becoming more and more popular for power electronic applications as new GaN and SiC power semiconductors with superior device characteristics compared to Silicon based switches are emerging.

In the standard cascode configuration of FIG. 1, only the power MOSFET $M_{Si}$ is controlled actively by a gate driver, which generates the gate signal $V_{GM}$. The GaN switch $M_{GaN}$ is controlled indirectly via the silicon MOSFET $M_{Si}$ as the MOSFET $M_{Si}$ drain-to-source voltage is connected to equal the GaN source-to-gate voltage.

Basic GaN transistors have a Schottky gate contact (non-isolated). In case of a positive voltage between the gate and the source or drain of a GaN transistor which is higher than the forward voltage of the Schottky contact, a current flows. FIG. 2 is a graph depicting exemplary gate contact behavior of such a GaN transistor. It can be clearly seen that the gate has a typical (Schottky) diode behavior with a knee voltage (in this exemplary case) of 0.9V (i.e. $V_F=0.9V$).

Because a GaN HEMT is a field effect transistor, the gate is not designed to conduct DC forward currents. But in case of a GaN HEMT that is used in a cascode configuration, a significant forward gate current ($I_G>0.4$ mA/µm2) can occur when the cascode switch is operated in reverse. The two possible current paths in the case of reverse conduction mode for the cascode circuit of FIG. 1 are shown in FIG. 3 by dashed arrows.

FIG. 4 comprises first and second graphs showing a measured variation of drain ($I_D$) and gate ($I_G$) current against voltage, respectively, for a 600V/250 mΩ. GaN switch in the cascode circuit of FIG. 1. For higher reverse drain currents, the GaN HEMT gate diode conducts. It is also seen that the gate current reaches a maximum of 360 mA at a drain current of 8 A (i.e. $I_G=360$ mA@$I_D=8$ A).

The GaN HEMT is a lateral device with gate, drain and source fingers on the die surface. An exemplary device layout and a cross section of a conventional GaN HEMT is shown in FIGS. 5A and 5B, respectively. The length of a single gate finger is 500 µm (i.e. $L_{GF}=500$ µm), while the total width of the HEMT transistor 48 mm. The thickness of the (Al) gate metal is 360 nm (i.e. Th=360 nm) with a finger width of 1.6 µm (i.e. $W_{GF}=1.6$ µm).

Assuming the most optimistic case of a constant current density across the gate finger, the maximum current density at the beginning of each gate finger may be estimated as follows:

$$J_G = \frac{I_G/W \times W_{GF}}{T \times L}$$

$$= \frac{360 \text{ mA}/48 \text{ mm} \times 0.5 \text{ mm}}{360 \text{ nm} \times 1.6 \text{ um}}$$

$$= 6.5 \text{ mA}/\mu m^2$$

Thus, it will be seen that the gate current density easily exceeds the electro migration limit of 0.4 mA/.mu.m2. Hence, the conventional GaN switch of the cascode circuit shown in FIG. 1 cannot be operated reliably in reverse conduction mode.

However, the reverse conduction mode is of significant importance in many power converter applications.

According to the invention, there is provided a cascode transistor circuit as defined in the claims.

According to one aspect, there is provided a cascode transistor circuit comprising: a first, depletion mode transistor having its drain connected to a high power line; a switching device connected between the source of the first transistor and a low power line; and a gate bias circuit connected between the gate of the first transistor and the low power line, the gate bias circuit being adapted to compensate the forward voltage of the diode function of the switching device, wherein the first transistor and the gate bias circuit are formed as part of an integrated circuit.

The invention provides a cascode circuit which includes a gate bias circuit which can compensate the forward voltage of a diode function of the switching device, such as the body diode of a silicon MOSFET for example. Embodiments may thus reduce the gate current for reverse drain currents and enable reliable operation in a reverse conduction mode.

Embodiments may enable cascode switches to be reliably operated in reverse. Such cascode switches may be employed for free-wheeling purposes, which can be beneficial due to reverse recovery charge and the associated switching losses being lower.

In a first example, the gate bias circuit comprises a pair of diodes connected in parallel and in opposite directions. A first of the two diodes is employed to ensure that the relationship between the forward voltage of the silicon MOSFET body diode and the forward voltage of the depletion mode transistor gate contact is favourable and thus reduces the gate current. The second of the two diodes is employed to ensure that the input capacitance of the depletion mode transistor is charged and discharged during switching.

The depletion mode transistor may comprise a high electron mobility transistor and the switching device may comprise a trench MOS transistor.

The invention also provides a circuit arrangement comprising a cascode transistor circuit of the invention. A power supply can use such a circuit arrangement.

An example of the invention will now be described in detail with reference to the accompanying drawings, in which.

An embodiment of the invention provides a cascode transistor circuit with a main depletion-mode transistor and a cascode MOSFET formed, with the two transistors packaged to form the cascode transistor circuit. A bias circuit is connected between the gate of the power transistor and the low power line of the circuit. The bias circuit is integrated into the transistor circuit for compensating the forward voltage of the body diode of the cascode MOSFET. Without the bias circuit, the Schottky gate is in parallel to the body diode of the cascode MOSFET. Since the forward voltages may be almost equal, a large current can flow through the Schottky gate.

The bias circuit artificially enlarges the forward voltage of the Schottky gate for reverse currents, so all current will flow through the MOSFET body diode.

The proposed cascode transistor circuit arrangement may therefore enable the cascode switches to be reliably operated in reverse.

Figure 1:
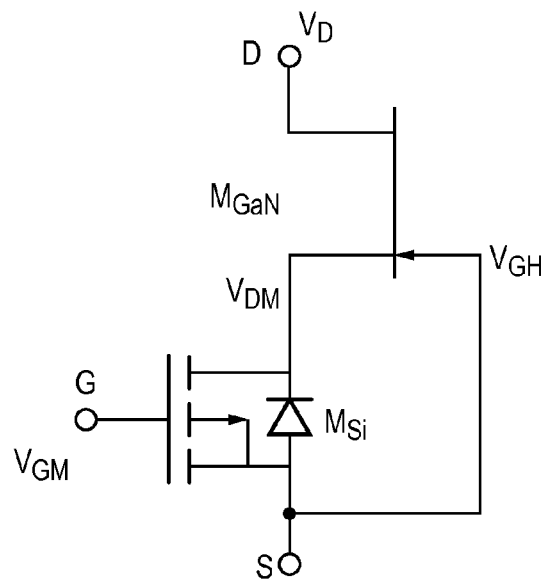
FIG. 1 shows a known cascode circuit.
Figure 2:
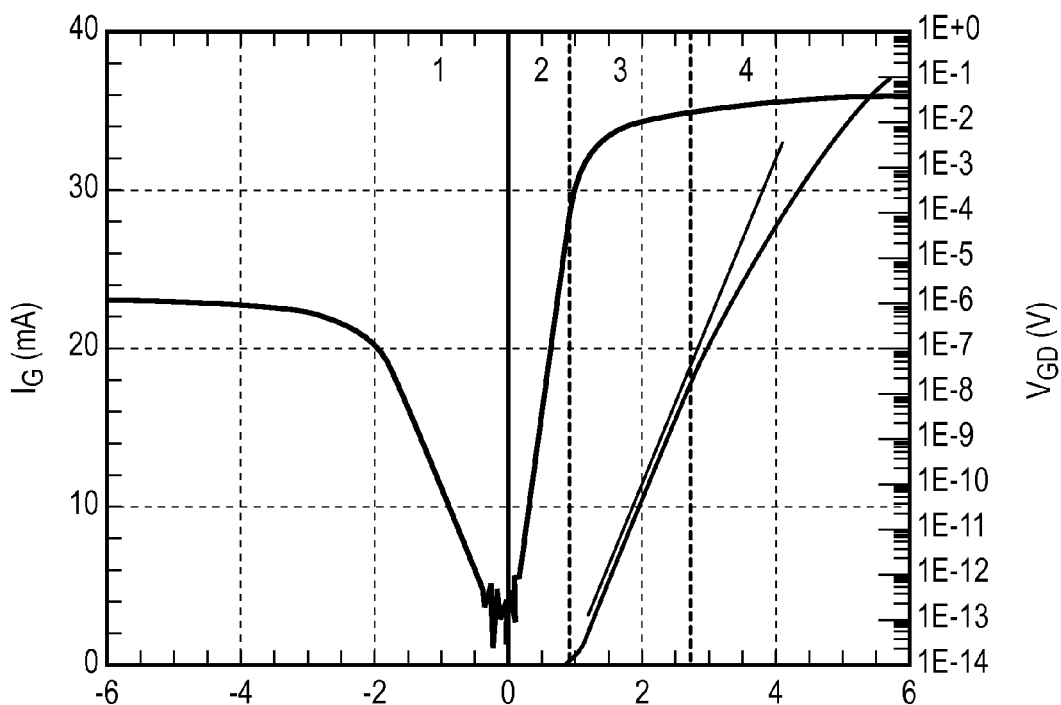
FIG. 2 is a graph depicting exemplary gate contact behavior of a conventional GaN transistor.
Figure 3:
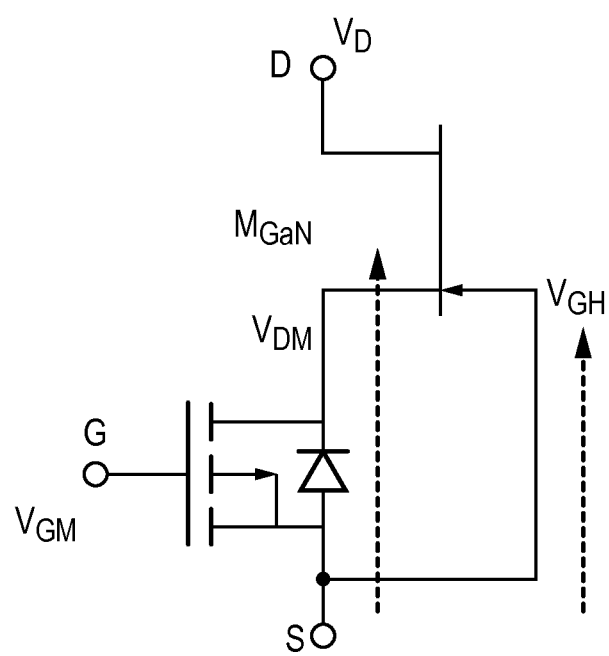
FIG. 3 depicts the two possible current paths in the case of reverse conduction mode for the cascode circuit of FIG. 1.
Figure 6:
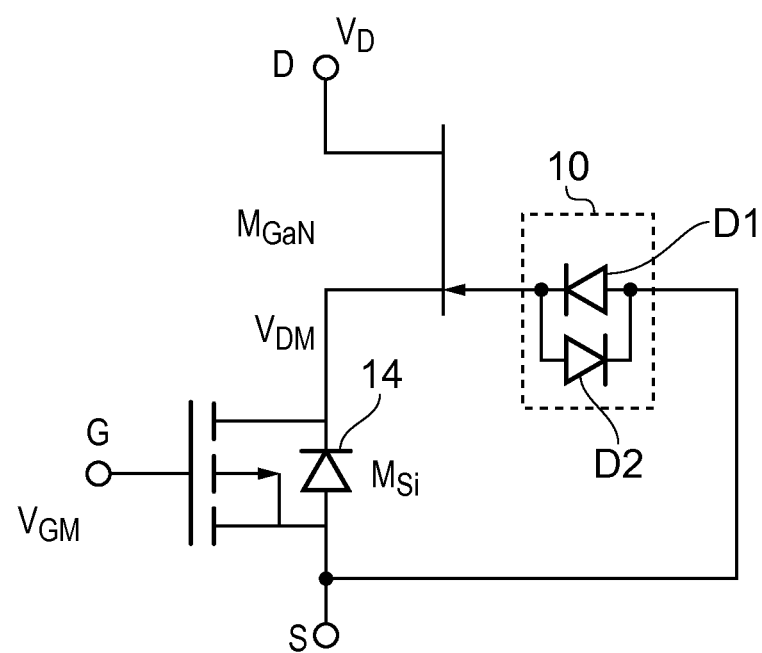
FIG. 6 shows a cascode transistor circuit according to an embodiment of the invention.

Referring to FIG. 6, there is shown a cascode transistor circuit according to an embodiment of the invention. The circuit is similar to the conventional circuit shown in FIG. 1 in that it comprises a series connection of a normally-on GaN transistor $M_{GaN}$ and a normally-off silicon MOSFET transistor $M_{Si}$ power switch in a cascode configuration between high and low power lines. More specifically, the drain of the GaN transistor $M_{GaN}$ is connected to a high power line voltage $V_D$ and the source of the GaN transistor $M_{GaN}$ is connected to the drain of the silicon MOSFET transistor $M_{Si}$. The silicon MOSFET transistor $M_{Si}$ has its source connected to the low power line voltage.

The high and low power lines together define a power supply, i.e. the high power line is the high side power rail and the low power line is the low side power rail of a pair of power rails.

The embodiment of FIG. 6, however, further comprises a gate bias circuit 10 connected between the gate of the GaN transistor $M_{GaN}$ and the source of silicon MOSFET transistor $M_{Si}$ (which is also connected to the low power line). More specifically, the gate bias circuit 10 comprises a pair of diodes D1, D2 connected in parallel and in opposite directions. The diodes D1, D2 may be referred to as being connected in an "anti-parallel" arrangement, since they are connected in parallel but in opposing forward directions. The forward direction of the first diode D1 is from the source of silicon MOSFET transistor $M_{Si}$ to the gate of the GaN transistor $M_{GaN}$, whereas the forward direction of the second diode D2 is from the gate of the GaN transistor $M_{GaN}$ to the source of silicon MOSFET transistor $M_{Si}$.

The diodes D1 and D2 are integrated with GaN transistor $M_{GaN}$ and so may be referred to as GaN integrated anti-parallel diodes.

These additional gate series diodes D1, D2 increase the barrier height of the GaN HEMT gate.

The relationship between the forward voltage of the silicon MOSFET $M_{Si}$ body diode 14 and the forward voltage of the GaN transistor $M_{GaN}$ gate contact is thus favourable.

Figure 4:
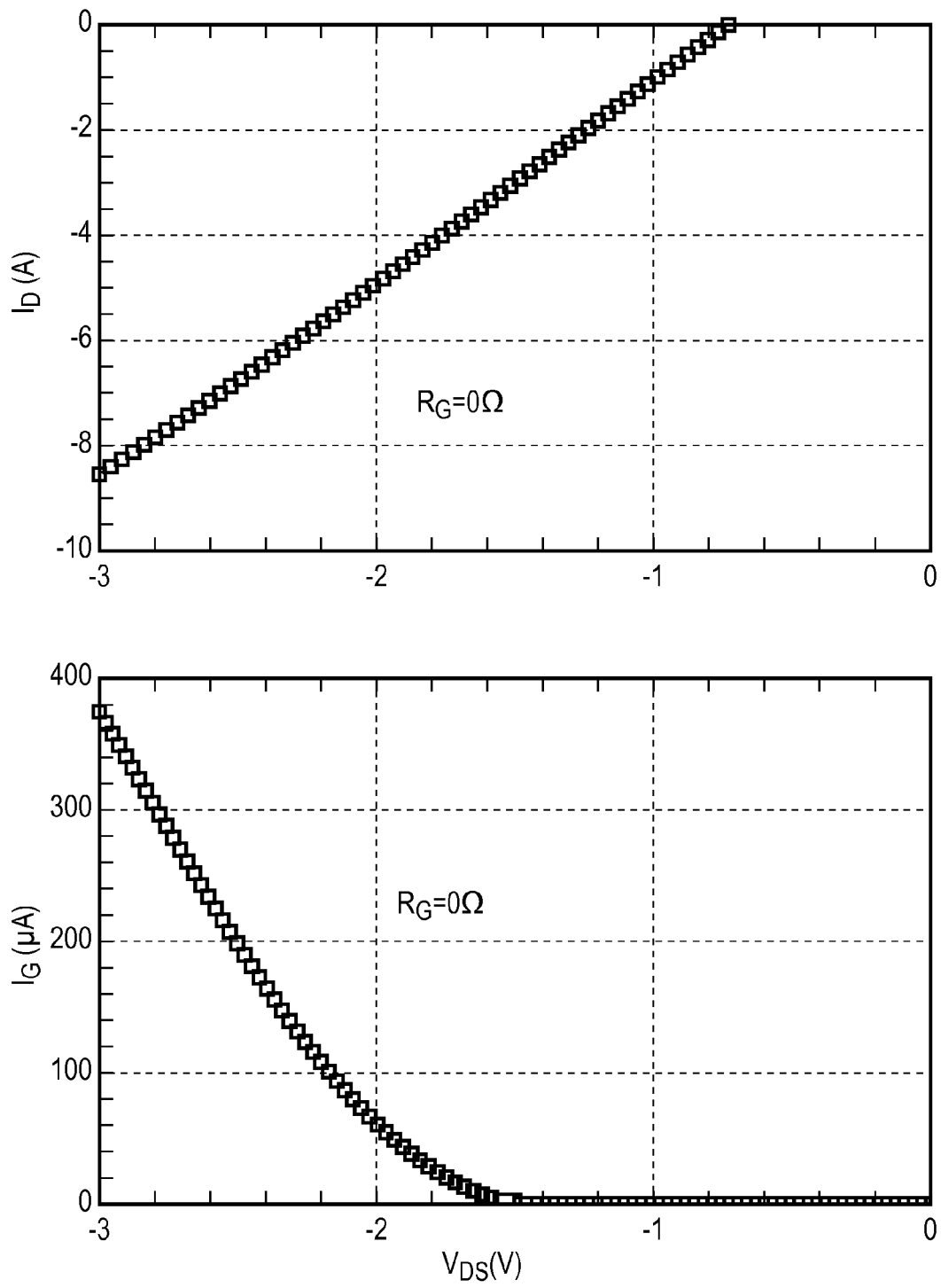
FIG. 4 depicts first and second graphs showing a measured variation of drain and gate current against voltage, respectively, for a 600V/250 mΩ. GaN switch in the cascode circuit of FIG. 1.
Figure 5A:
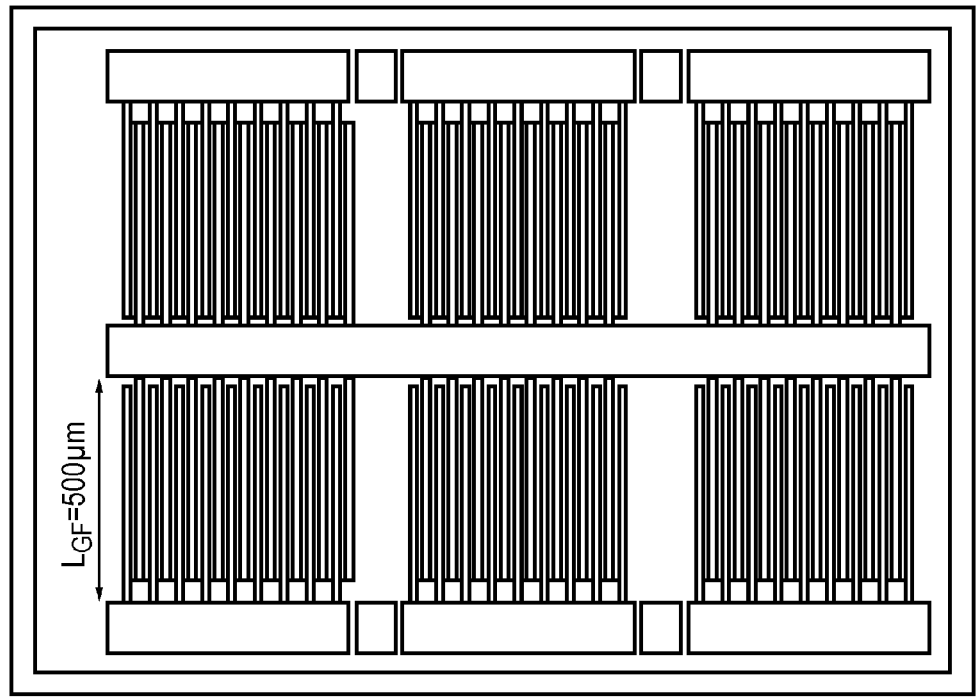
FIGS. 5A and 5B depict an exemplary device layout and a cross section, respectively, of a conventional GaN HEMT.
Figure 5B:
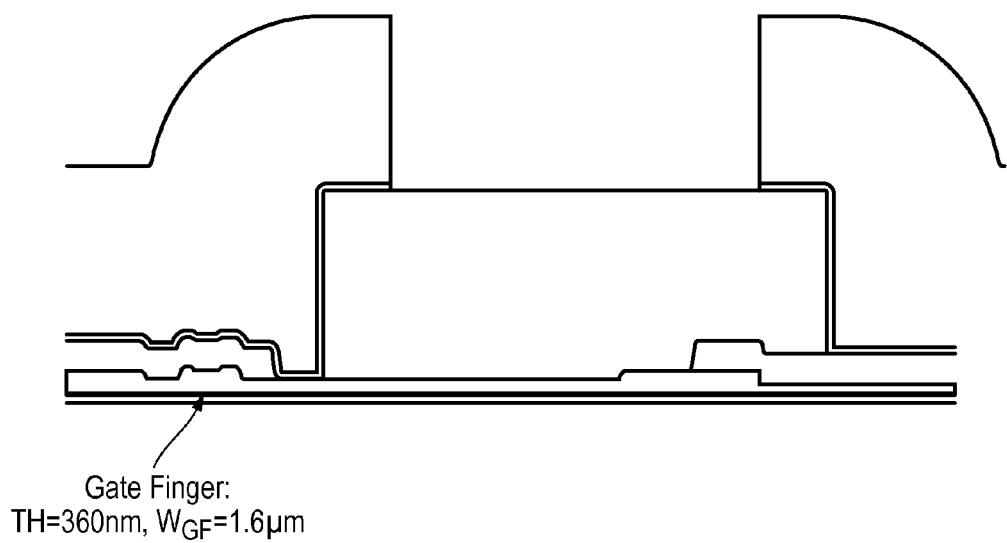
Figure 7:
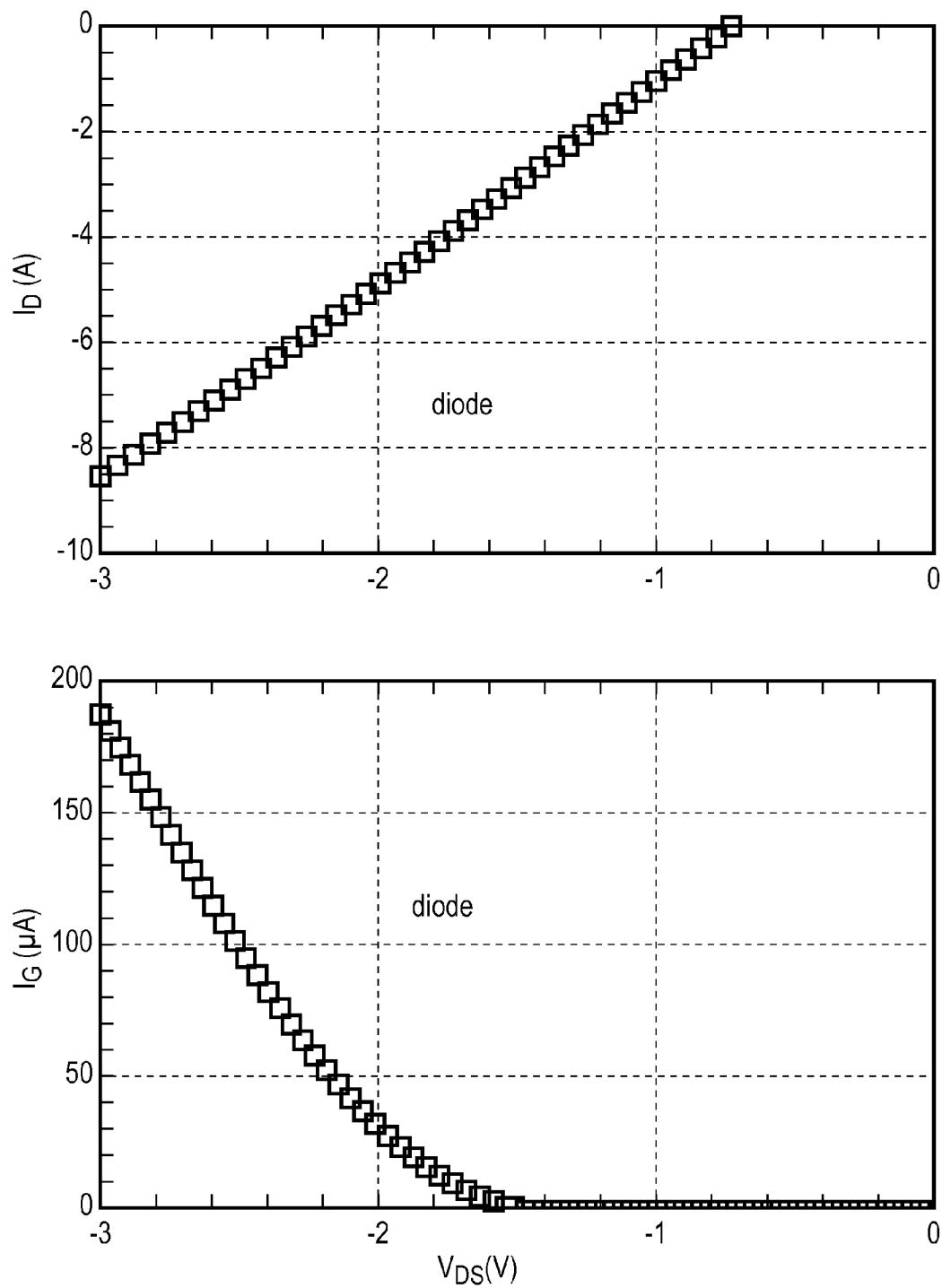
FIG. 7 depicts first and second graphs showing a measured variation of drain and gate current against voltage, respectively, for the GaN switch in the cascode transistor circuit of FIG. 6.

FIG. 7 depicts first and second graphs showing a measured variation of drain and gate current against voltage, respectively, for the 600V/250 mΩ GaN transistor $M_{GaN}$ in the cascode circuit of FIG. 6;

It is seen that the gate current is reduced significantly (to $I_G$=160 μA at a drain current of $I_D$=8 A) when compared to the gate current measurements for a conventional GaN transistor cascode circuit depicted in FIG. 4.

For this example, the maximum gate current density can be calculated as follows:

$$J_G = \frac{160 \ \mu A/48 \ mm \times 0.5 \ mm}{360 \ nm \times 1.6 \ um}$$
$$= 2.9 \ \mu A/\mu m^2$$

This value for the gate current density is well below the electro migration limit of 0.4 mA/μm2. The drain current, and therefore the reverse conduction capability, of the cascode circuit is maintained.

The second anti-parallel diode D2 is employed to ensure that the input capacitance of the GaN transistor $M_{GaN}$ gets charged and discharged during switching. In other words, the second anti-parallel diode D2 enables the gate current to flow in two directions.

Figure 8:
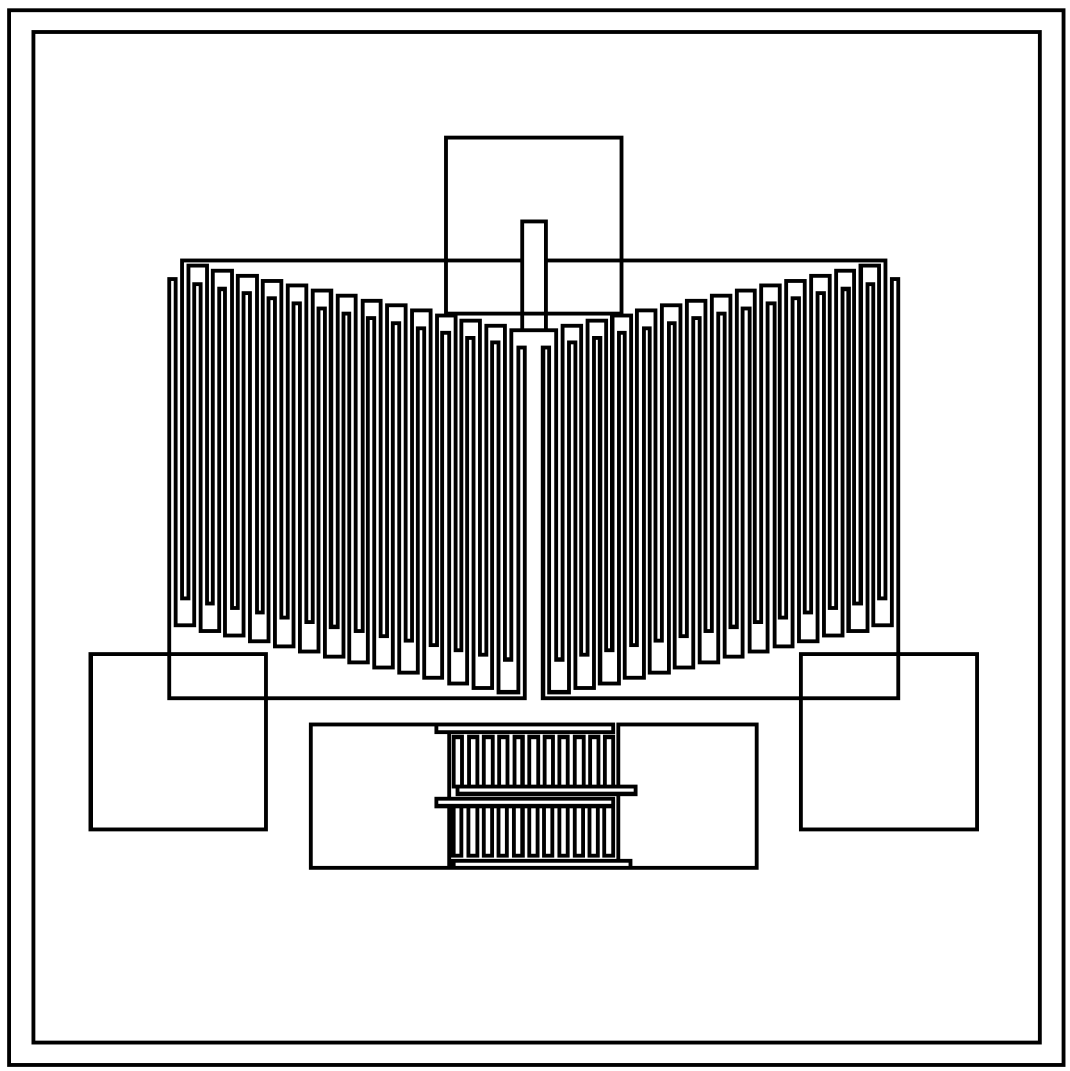
FIG. 8 depicts an exemplary device layout according to an embodiment of the invention.

The anti-parallel gate diodes D1 and D2 can be easily integrated on the GaN die next to the transistor $M_{GaN}$. By way of example, FIG. 8 depicts a GaN HEMT with the integrated anti-parallel diodes D1 and D2 according to an embodiment. Here, the diodes D1 and D2 require about 6.5% of the total active area of the integrated device.

A cascode circuit according to an embodiment can be formed as a packaged device. Such a packaged device can, for example, have a first connection from the drain of the GaN transistor $M_{GaN}$ to a first package terminal, a second connection from the gate of the silicon MOSFET transistor $M_{Si}$ to a second package terminal, and a third connection from the source of the silicon MOSFET transistor $M_{Si}$ to a third package terminal. One of the package terminals can comprise a die attach pad terminal.

Embodiments may be employed in power conversion applications in which normally-off switches are required and GaN cascode devices provide a benefit. Exemplary applications include: Power Factor Correction (PFC) circuits (e.g. grid connected power supplies); phase legs of high voltage inverter circuits (e.g. motor drives or photovoltaic inverters); and soft switching converter circuits.

Figure 9:
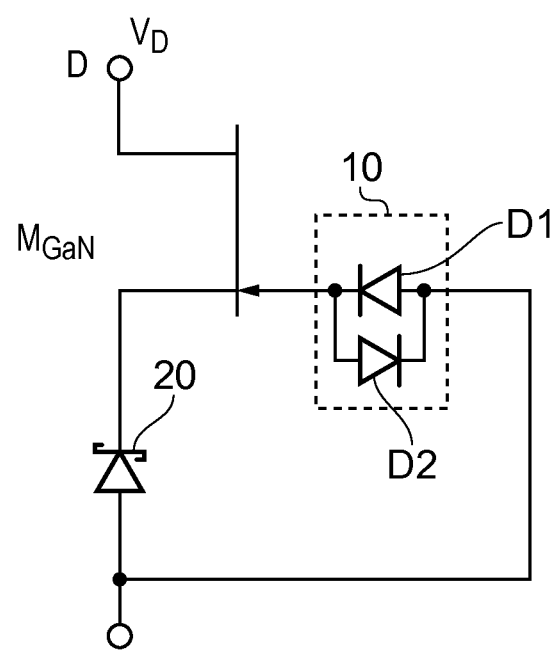
FIG. 9 shows a cascode transistor circuit according to another embodiment of the invention.

Referring to FIG. 9, there is shown a cascode transistor circuit according to another embodiment of the invention. The circuit is the same as the circuit shown in FIG. 6 except that the MOSFET transistor $M_{Si}$ power switch has been replaced with a Schottky diode 20. Thus, the circuit comprises a series connection of a normally-on GaN transistor $M_{GaN}$ and a Schottky diode 20 in a cascode configuration between high and low power lines. More specifically, the drain of the GaN transistor $M_{GaN}$ is connected to a high power line voltage $V_D$ and the Schottky diode 20 is connected between the source of the GaN transistor $M_{GaN}$ and the low power line voltage. The forward direction of the Schottky diode 20 is from the low power line to the source of the GaN transistor $M_{GaN}$.

As with the embodiment of FIG. 6, the embodiment of FIG. 9 comprises a gate bias circuit 10 connected between the gate of the GaN transistor $M_{GaN}$ and the low power line). The gate bias circuit 10 comprises a pair of diodes D1, D2 connected in parallel and in opposite directions. As before, the diodes D1, D2 may be referred to as being connected in an "anti-parallel" arrangement, since they are connected in parallel but in opposing forward directions. The diodes D1 and D2 are integrated with GaN transistor $M_{GaN}$ and so may be referred to as GaN integrated anti-parallel diodes. The bias circuit artificially enlarges the forward voltage of the Schottky gate for reverse currents, so all current will flow through the Schottky diode 20.

Thus, in essence, the MOSFET transistor $M_{Si}$ of the embodiment of FIG. 6 has been replaced with a diode 20 to obtain a superior high voltage diode. The GaN transistor $M_{GaN}$ will block the high voltage and the low voltage diode 20 defines the reverse recovery charge, which will be very low.

Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measured cannot be used to advantage. Any reference signs in the claims should not be construed as limiting the scope.

The invention claimed is:

1. A cascode transistor circuit comprising:
a first, depletion mode transistor having its drain connected to a high power line;
a switching device connected between the source of the first transistor and a low power line, the switching device comprising a diode function for enabling reverse current flow in the first transistor; and
a gate bias circuit connected between the gate of the first transistor and the low power line, the gate bias circuit being adapted to compensate the forward voltage of the diode function of the switching device such that a forward voltage of the gate of the first transistor is increased for reverse current flows, wherein the gate bias circuit comprises first and second diodes connected in parallel and in opposing directions with the cathode of the first diode connected directly to the anode of the second diode and the cathode of the second diode connected directly to the anode of the first diode;
wherein the first transistor and the gate bias circuit are formed as part of an integrated circuit.

2. A circuit as claimed in claim 1, wherein the first, depletion mode transistor comprises a gallium nitride or silicon carbide transistor.

3. A circuit as claimed in claim 1, wherein the first, depletion mode transistor comprises a high electron mobility transistor.

4. A circuit as claimed in claim 1, wherein the switching device comprises a silicon MOSFET with its drain connected to the source of the first transistor and its source connected to the low power line, the silicon MOSFET comprising a body diode.

5. A circuit as claimed in claim 4, wherein the silicon MOSFET comprises a trench MOS transistor.

6. A circuit as claimed in claim 1, formed as a packaged device, with a first connection from the first transistor drain to a first package terminal, a second connection from the switching device to a second package terminal, wherein one of the package terminals comprises a die attach pad terminal.

7. A circuit arrangement comprising:
a cascode transistor circuit as claimed in claim 1.

8. A device comprising a circuit arrangement as claimed in claim 7, wherein the device comprises:
a power supply; or
a power factor correction circuit; or
an inverter circuit; or
a switched mode power converter circuit.

9. A cascode transistor circuit comprising:
a depletion mode transistor having its drain connected to a high power line;
a switching device connected between the source of the depletion mode transistor and a low power line, the switching device comprising a diode function for enabling reverse current flow in the depletion mode transistor; and
a gate bias circuit connected between the gate of the depletion mode transistor and the low power line, the gate bias circuit being adapted to compensate the forward voltage of the diode function of the switching device such that a forward voltage of the gate of the depletion mode transistor is increased for reverse current flows;
wherein the depletion mode transistor and the gate bias circuit are formed on the same die;
wherein the gate bias circuit comprises first and second diodes connected in parallel and in opposing directions with the cathode of the first diode connected directly to the anode of the second diode and the cathode of the second diode connected directly to the anode of the first diode;
wherein the depletion mode transistor comprises a gallium nitride or silicon carbide transistor;
wherein the switching device comprises a silicon MOSFET with its drain connected to the source of the depletion mode transistor and its source connected to the low power line.

10. A circuit arrangement comprising:
a cascode transistor circuit as claimed in claim 9.

11. A circuit arrangement as claimed in claim 10, formed as a packaged device, with a first connection from the drain of the depletion mode transistor to a first package terminal, a second connection from the switching device to a second package terminal, wherein one of the package terminals comprises a die attach pad terminal.

12. A cascode transistor circuit comprising:
a depletion mode transistor having its drain connected to a high power line, wherein the depletion mode transistor comprises a gallium nitride or silicon carbide transistor;
a switching device connected between the source of the depletion mode transistor and a low power line, the switching device comprising a diode function for enabling reverse current flow in the depletion mode transistor; and
a gate bias circuit connected between the gate of the depletion mode transistor and the low power line and comprising first and second diodes connected in parallel and in opposing directions with the cathode of the first diode connected directly to the anode of the second diode and the cathode of the second diode connected directly to the anode of the first diode, the gate bias circuit being adapted to compensate the forward voltage of the diode function of the switching device such that a forward voltage of the gate of the depletion mode transistor is increased for reverse current flows;
wherein the depletion mode transistor and the gate bias circuit are formed on the same die.

* * * * *